(12) United States Patent
Hung et al.

(10) Patent No.: US 11,715,742 B2
(45) Date of Patent: Aug. 1, 2023

(54) WIRING STRUCTURE AND ELECTRONIC DEVICE INCLUDING THE SAME

(71) Applicants: Luca Hung, Tainan (TW); Lavender Cheng, Tainan (TW)

(72) Inventors: Luca Hung, Tainan (TW); Lavender Cheng, Tainan (TW)

(73) Assignee: Innolux Corporation, Miao-Li County (TW)

( * ) Notice: Subject to any disclaimer, the term of this patent is extended or adjusted under 35 U.S.C. 154(b) by 141 days.

(21) Appl. No.: 17/095,588

(22) Filed: Nov. 11, 2020

(65) Prior Publication Data

US 2022/0149078 A1  May 12, 2022

(51) Int. Cl.

| | | |
|---|---|---|
| G02F 1/1362 | (2006.01) | |
| H01L 27/12 | (2006.01) | |
| G02F 1/1339 | (2006.01) | |
| H01Q 1/38 | (2006.01) | |
| G02F 1/1368 | (2006.01) | |
| H10K 59/131 | (2023.01) | |

(52) U.S. Cl.
CPC .......... *H01L 27/124* (2013.01); *G02F 1/1339* (2013.01); *G02F 1/1368* (2013.01); *G02F 1/136286* (2013.01); *H01Q 1/38* (2013.01); *G02F 2202/28* (2013.01); *H10K 59/1315* (2023.02)

(58) Field of Classification Search
CPC . H01L 27/124; H01L 27/3279; G02F 1/1339; G02F 1/136286; G02F 1/1368; G02F 2202/28; G02F 1/1345; H01Q 1/38; H10K 59/1315
See application file for complete search history.

(56) References Cited

U.S. PATENT DOCUMENTS

2002/0067456 A1 *  6/2002  Tatsumi ................. H05K 1/117
                                                           349/149
2004/0135941 A1     7/2004  Nam et al.

* cited by examiner

*Primary Examiner* — James A Dudek
(74) *Attorney, Agent, or Firm* — Patterson + Sheridan, LLP

(57) ABSTRACT

A wiring structure and an electronic device including the wiring structure are provided. The wiring structure includes a plurality of wires, and each of the wires has a first portion and a second portion. The first portion and the second portion respectively have a first width W1 and a second width W2. The second width W2 is different from the first width W1. In addition, at least one of the wires satisfies an equation as follows:

$$0 \leq |AR2 - AR1| < \frac{|W2 - W1|}{W1},$$

wherein AR1 and AR2 are aperture ratios of the first portion and the second portion, respectively.

18 Claims, 14 Drawing Sheets

WIRING STRUCTURE AND ELECTRONIC DEVICE INCLUDING THE SAME

BACKGROUND

Technical Field

The present disclosure relates to an electronic device, and in particular it relates to a wiring structure of an electronic device.

Description of the Related Art

Electronic products such as display devices, antenna devices and sensor devices have become indispensable necessities in modern society. With the flourishing development of these electronic products, consumers have high expectations regarding their quality, functionality, and price.

Adhesive materials are often used to connect the substrates of an electronic device. The adhesive materials may overlap some components in the electronic device. For example, the adhesive materials may overlap the wiring structure disposed on the substrate. In some cases, the wiring structure needs to be patterned to have apertures so that the adhesive materials can be cured by applying light thereto. However, the apertures will increase the resistance of the wiring structure and affect the performance of the wiring structure.

As described above, the existing structure of an electronic device has not been satisfactory in all respects, and the developments of the structural design that can improve the performance of the electronic device are still needed.

SUMMARY

In accordance with some embodiments of the present disclosure, a wiring structure is provided. The wiring structure includes a plurality of wires, and each of the plurality of wires has a first portion and a second portion. The first portion and the second portion respectively have a first width W1 and a second width W2. The second width W2 is different from the first width W1. In addition, at least one of the plurality of wires satisfies an equation as follows:

$$0 \leq |AR2 - AR1| < \frac{|W2 - W1|}{W1},$$

wherein AR1 and AR2 are aperture ratios of the first portion and the second portion, respectively.

In accordance with some embodiments of the present disclosure, an electronic device is provided. The electronic device includes a first substrate, a second substrate, the wiring structure as described above, and an adhesive material. The wiring structure is disposed on at least one of the first substrate and the second substrate. The adhesive material seals the first substrate and the second substrate. In addition, at least a portion of the wiring structure overlaps the adhesive material.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
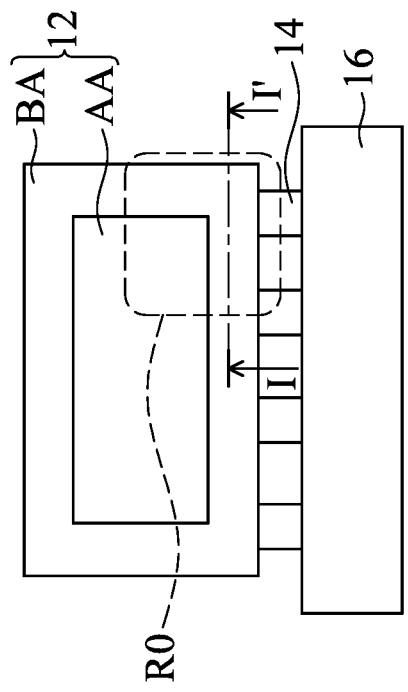
FIG. 1A is a top-view diagram of an electronic device in accordance with some embodiments of the present disclosure.

The wiring structure and the electronic device of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure.

It should be understood that in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that when an element or layer is referred to as being "disposed on" another element or layer, it can be directly disposed on the other element or layer, or intervening elements or layers may be presented. In contrast, when an element is referred to as being "directly disposed on" another element or layer, there are no intervening elements or layers presented.

In some embodiments of the present disclosure, terms concerning connection, coupling and the like, such as "connected" and "interconnected", unless otherwise specifically defined, may refer to two structures being in direct contact, or may refer to two structures not being in direct contact and there are other structures between these two structures. In addition, the term "electrically connected to" may refer to "directly electrically connected to" or "indirectly electrically connected to".

In addition, it should be understood that, the ordinal numbers used in the specification and claims, such as the terms "first", "second", etc., are used to modify an element, which does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. The ordinal numbers used to modify the same element may be different in the claims and the specification. Accordingly, the term "first element" in the specification may refer to the "second element" in the claims.

The terms "about", "approximately" and "substantially" typically mean+/−10% of the stated value, or +/−5% of the stated value, or +/−3% of the stated value, or +/−2% of the stated value, or +/−1% of the stated value or +/−0.5% of the stated value. The stated value of the present disclosure is an approximate value. When there is no specific description, the stated value includes the meaning of "about", "approximately", or "substantially". Furthermore, the phrase "in a range from a first value to a second value" or "in a range between a first value and a second value" indicates that the range includes the first value, the second value, and other values between them.

Certain terms are used in the specification and appended claims of the present application to refer to specific elements. Those skilled in the art should understand that electronic device manufacturers may refer to the same element by using different names. The present disclosure does not intend to distinguish between components that have the same function but different names. In the following description and claims, the terms "include" and "comprise" are open-ended words, and thus they should be interpreted as meaning "include but is not limited to . . . ".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Furthermore, it should be understood that the features in the various embodiments can be combined, modified, substituted, or recombined without departing from the spirit and scope of the disclosure.

In accordance with some embodiments of the present disclosure, an electronic device including a wiring structure is provided. The width and the aperture ratio of the wiring structure are designed to satisfy a particular equation. Accordingly, the curing performance of the adhesive material in different areas of the electronic device can be consistent. In addition, the resistance of the wiring structure can be maintained.

Refer to FIG. 1A, which is a top-view diagram of an electronic device 10 in accordance with some embodiments of the present disclosure. It should be understood that only some of the elements of the electronic device 10 are illustrated in FIG. 1A for clarity. In accordance with some embodiments, additional features or elements may be optionally added to the electronic device 10. In accordance with some embodiments, some features of the electronic device 10 described below may be optionally replaced or omitted.

In accordance with some embodiments, the electronic device 10 may include a display device, an antenna device, a sensing device, a tiled device, other suitable device, or a combination thereof, but it is not limited thereto. The display device may include a touch display device, a curved display device, or a free-shape display device. The electronic device 10 may be a bendable or flexible electronic device. In addition, the electronic device 10 may include light-emitting diodes (LEDs), fluorescence material, phosphor, quantum dot (QD), another suitable material, or a combination thereof, but it is not limited thereto. The light-emitting diode may include, for example, an inorganic light-emitting diode, an organic light-emitting diode (OLED), a mini light-emitting diode (mini LED), a micro light-emitting diode (micro LED), or a quantum dot (QD) light-emitting diode (QLED or QDLED), or a combination thereof, but it is not limited thereto. The antenna device may be, for example, a liquid-crystal antenna device, but it is not limited thereto. The tiled device may be, for example, a tiled display device or a tiled antenna device, but it is not limited thereto. It should be noted that the electronic device 10 in the present disclosure can be any combination of the foregoing, but is not limited thereto. In addition, the shape of the electronic device 10 may be rectangular, circular, polygonal, a shape with curved edges, or other suitable shapes. In addition, in accordance with some embodiments, the electronic device 10 may have peripheral systems such as a driving system, a control system, a light source system, a shelf system, etc. to support a display device or an antenna device.

Figure 1B:
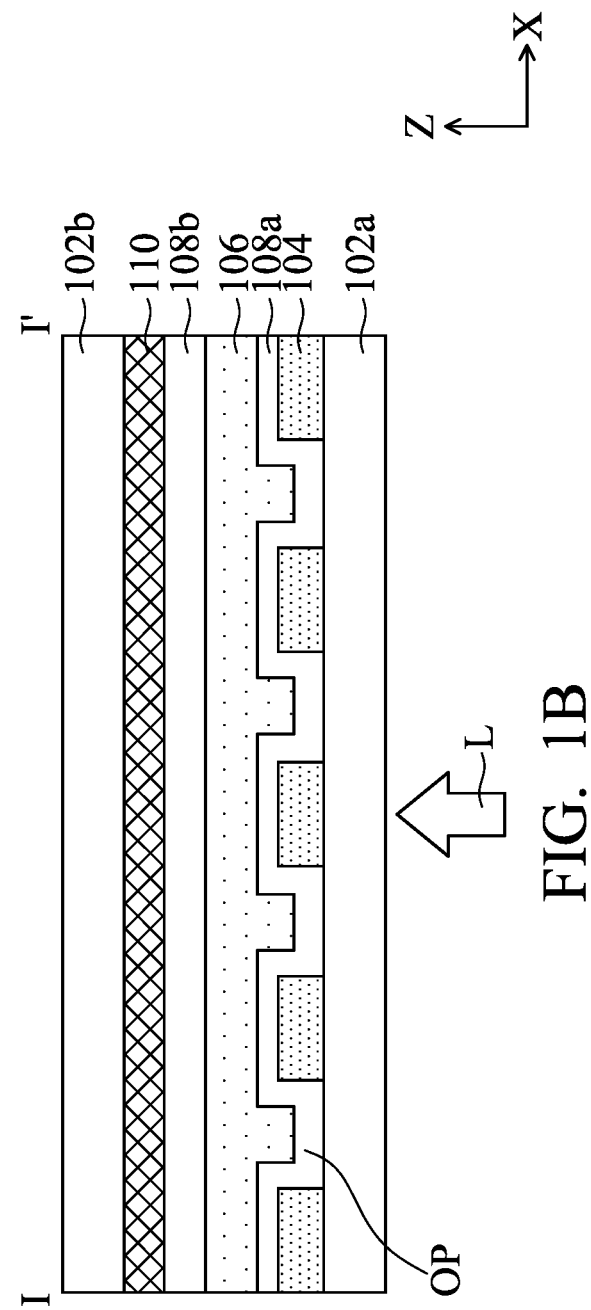
FIG. 1B is a cross-sectional diagram of an electronic device along line segment I-I' in FIG. 1A in accordance with some embodiments of the present disclosure.

Refer to FIG. 1A and FIG. 1B. FIG. 1B is a cross-sectional diagram of the electronic device 10 along line segment I-I' in FIG. 1A in accordance with some embodiments of the present disclosure. In accordance with some embodiments, the electronic device 10 may include a panel 12, a flexible circuit board (FCB) 14, an adhesive material 106 and a printed circuit board (PCB) 16. In accordance with some embodiments, the panel 12 may be electrically connected to the printed circuit board 16 through the flexible circuit board 14. Specifically, in accordance with some embodiments, the electronic device 10 may be an organic light-emitting diode display device, a liquid-crystal display device, or a liquid-crystal antenna device. The panel 12 may include an active area AA, a peripheral area BA, a substrate 102a, a substrate 102b, and a wiring structure 104. The peripheral area BA of the panel 12 may be adjacent to or surround the active area AA of the panel 12. In accordance with some embodiments, the active area AA of the panel 12 may include a driving element, a display element, a working element, a modulating element, or a combination thereof, but it is not limited thereto. In accordance with some embodiments, the active area AA of the panel 12 may correspond to a working area and the peripheral area BA of the panel 12 may correspond to a non-working area of the electronic device 10. In the embodiments where the electronic device 10 is a light-emitting diode display device or a liquid-crystal display device, the active area AA of the panel 12 may be a display area, and the peripheral area BA of the panel 12 may include the areas of peripheral circuits or the adhesive material 106. In the embodiments where the electronic device 10 is a liquid-crystal antenna device, the peripheral area BA of the panel 12 may include the areas of peripheral circuits or the adhesive material 106, and the areas other than those described above may be the active area AA of the panel 12. In accordance with some embodiments, the wiring structure 104 (shown in FIG. 1B) may be disposed in the peripheral area BA. In accordance with some embodiments, the wiring structure 104 may extend from the active area AA to the peripheral area BA and may be electrically connected to the driving element, the display element, the working element, or the modulating element in the active area AA. It should be noted that although the wiring structure 104 is disposed directly on the substrate 102a in FIG. 1B (e.g., the wiring structure 104 may serve as first-level metal layer M1), the wiring structure 104 may be not directly on the substrate 102a and there may be intervening layers between the wiring structure 104 and the substrate 102a (e.g., the wiring structure 104 may serve as second-level metal layer M2) in accordance with some other embodiments. In accordance with some embodiments, the wiring structure 104 may serve as the first-level metal layer M1 and the second-level metal layer M2 at the same time.

In accordance with some embodiments, the substrate 102a may be opposite to the substrate 102b and the wiring structure 104 may be disposed on the substrate 102a. In accordance with some embodiments, the substrate 102a on which the wiring structure 104 is disposed may serve as a driving substrate, and it may adopt an active matrix driving circuit or a passive matrix driving circuit. In accordance with some embodiments, the driving element may be disposed on the substrate 102a using a packaging method of chip on film (COF) or chip on glass (COG), but it is not limited thereto.

In accordance with some embodiments, the substrate 102a and the substrate 102b may be a flexible substrate, a rigid substrate, or a combination thereof. In accordance with some embodiments, the materials of the substrate 102a and the substrate 102b may include, but are not limited to, glass, quartz, sapphire, ceramic, polyimide (PI), polycarbonate (PC), polyethylene terephthalate (PET), polypropylene (PP), another suitable material, or a combination thereof. In accordance with some embodiments, the material of the substrate 102a may be the same as or different from that of the substrate 102b. In addition, the transmittance of the substrate 102a and the substrate 102b is not particularly limited. That is, the substrate 102a and the substrate 102b may be a light-transmitting substrate, a semi-transmitting substrate, or a non-transmitting substrate.

As described above, the wiring structure 104 may be electrically connected to the elements located in the active area AA. In addition, the wiring structure 104 may transmit the signals from the active area AA to the peripheral area BA. For example, the signals may include Vcom signals, VGH signals, VGL signals, clock signals, STV signals, or data signals, but it is not limited thereto. In accordance with some embodiments, the material of the wiring structure 104 may include a conductive material. In accordance with some embodiments, the conductive material may include, but is not limited to, a metal conductive material, a transparent conductive material, or a combination thereof. For example, the metal conductive material may include, but is not limited to, copper (Cu), aluminum (Al), tungsten (W), titanium (Ti), gold (Au), platinum (Pt), nickel (Ni), copper alloy, aluminum alloy, tungsten alloy, titanium alloy, gold alloy, platinum alloy, nickel alloy, other suitable conductive materials, or a combination thereof. The transparent conductive material may include transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials, or a combination thereof.

As shown in FIG. 1B, the wiring structure 104 may have a plurality of apertures OP. In accordance with some embodiments, the apertures OP may be formed by a patterned process. The patterned process may include a photolithography process and/or an etching process. The photolithography process may include, but is not limited to, photoresist coating (such as spin coating), soft baking, hard baking, mask alignment, exposure, post-exposure baking, photoresist development, cleaning and drying. The etching process may include a dry etching process or a wet etching process, but it is not limited thereto.

Refer to FIG. 1B, in accordance with some embodiments, the adhesive material 106 may be disposed between the substrate 102a and the substrate 102b. The adhesive material 106 may seal the substrate 102a and the substrate 102b together. In some embodiments, at least a portion of the wiring structure 104 may overlap the adhesive material 106. In accordance with some embodiments, the adhesive material 106 may include a photo-curable adhesive, a photo-thermal-curable adhesive, another suitable adhesive material or a combination thereof, but it is not limited thereto. In accordance with some embodiments, the adhesive material 106 may include epoxy resin, acrylic resin, filler, photo-initiator, coupling agent or a combination thereof, but it is not limited thereto. In some embodiments, the adhesive material 106 may include, but is not limited to, an optical clear adhesive (OCA), an optical clear resin (OCR), a glass frit, or a combination thereof. In some embodiments, the wiring structure 104 may be disposed between the adhesive material 106 and the substrate 102a.

In addition, in accordance with some embodiments, the panel 12 may further include a protective layer 108a, a protective layer 108b, and a shielding layer 110. The protective layer 108a may be disposed between the substrate 102a and the adhesive material 106. The protective layer 108b may be disposed between the substrate 102b and the adhesive material 106. The shielding layer 110 may be disposed on the substrate 102b and between the substrate 102b and the protective layer 108b.

In accordance with some embodiments, the protective layer 108a and the protective layer 108b may include an inorganic material, an organic material, or a combination thereof. In accordance with some embodiments, the inorganic material may include, but is not limited to, silicon nitride, silicon oxide, silicon oxynitride, another suitable material, or a combination thereof. In accordance with some embodiments, the organic material may include, but is not limited to, polyethylene terephthalate (PET), polyethylene (PE), polyethersulfone (PES), polycarbonate (PC), polymethylmethacrylate (PMMA), polyimide (PI), epoxy resin, polyurethane (PU), silicone, parylene, polytetrafluoroethylene (PTFE), another suitable material, or a combination thereof.

In accordance with some embodiments, the shielding layer 110 may at least partially overlap the wiring structure 104 in a normal direction of the substrate 102a (e.g., the Z direction in the drawing). The shielding layer 110 may shield the wiring structure 104 so that the wiring structure 104 is not been seen from a front side (e.g., the side near the substrate 102b) of the electronic device 10. In accordance with some embodiments, the shielding layer 110 may include an opaque material such as a black matrix material, but it is not limited thereto. For example, the black matrix material may include, but is not limited to, organic resins, glass pastes, and resins or pastes including black pigments, metallic particles such as nickel, aluminum, molybdenum, and alloys thereof, metal oxide particles (e.g. chromium oxide), or metal nitride particles (e.g. chromium nitride), or any other suitable materials.

It should be noted that, in accordance with some embodiments, a light source L may be provided near the substrate 102a (e.g., the back side of the electronic device 10) where the wiring structure 104 is disposed. The light emitted from the light source L can penetrate through the apertures OP of the wiring structure 104 and cure with the adhesive material 106.

Figure 2:
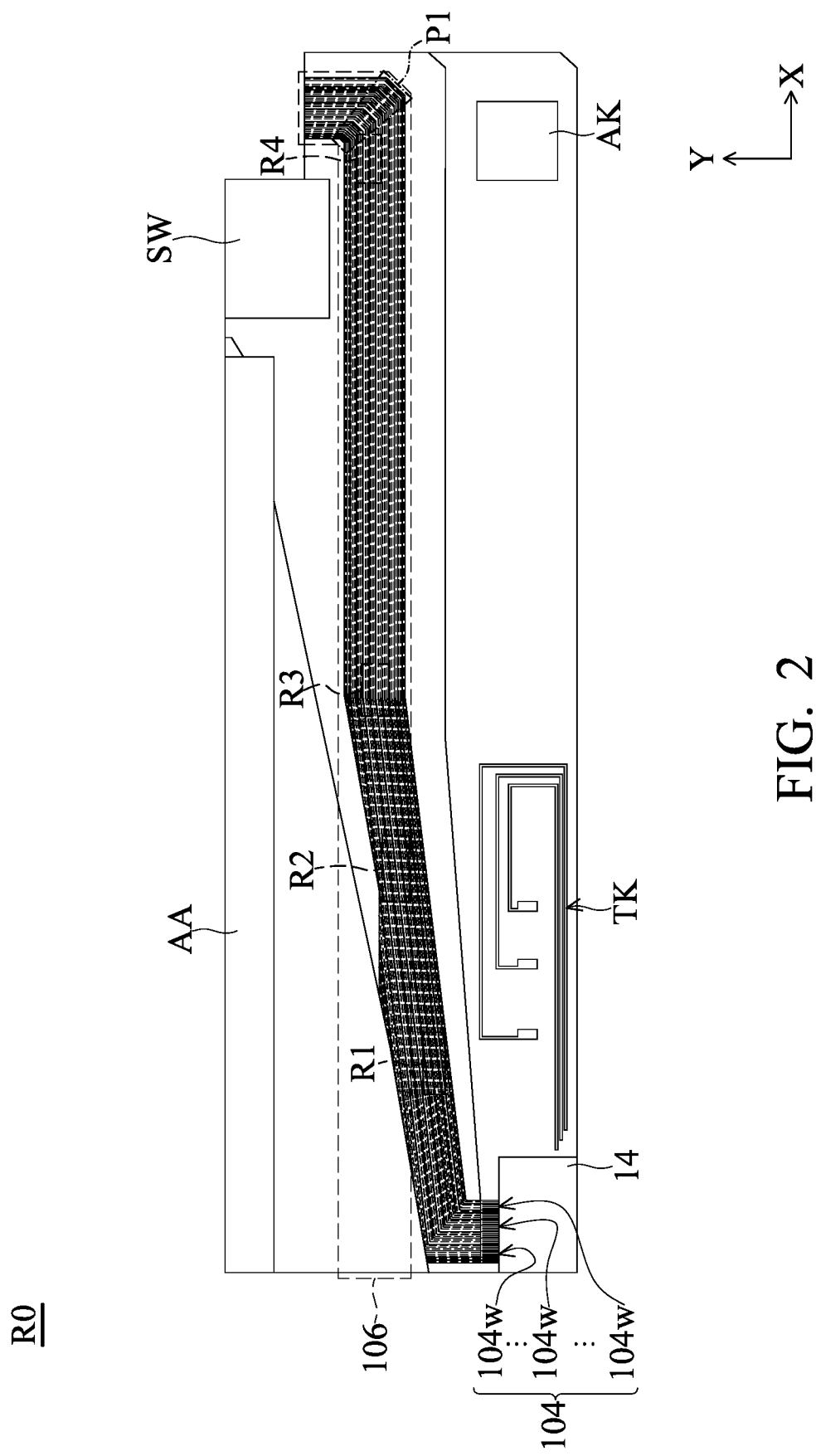
FIG. 2 is a top-view diagram of an area of an electronic device in FIG. 1A in accordance with some embodiments of the present disclosure.

Refer to FIG. 2, which is a top-view diagram of an area R0 of the electronic device 10 in FIG. 1A in accordance with some embodiments of the present disclosure. In addition, the same or similar components (or elements) in the following paragraph will be denoted by the same or similar reference numbers, and their materials, manufacturing methods and functions are the same or similar to those described above, and thus they will not be repeated in the following context.

As shown in FIG. 2, the wiring structure 104 may include a plurality of wires 104w, the wires 104w may be arranged adjacent to each other and separated from each other for a distance. The wires 104w may be patterned to have the apertures OP. In accordance with some embodiments, the wires 104w may be electrically connected to the flexible circuit board 14. In accordance with some embodiments, the panel 12 may further include a switch structure SW disposed on the substrate 102a, and at least one of the wires 104w may be electrically connected to the switch structure SW. The switch structure SW may include, but is not limited to, at least one of switching transistors. In some embodiments, the switch structure SW may include a gate driving circuit disposed on panel (GOP circuit). In accordance with some embodiments, the panel 12 may further include a driving transistor, a reset transistor, or another suitable thin-film transistor, but it is not limited thereto.

In addition, in accordance with some embodiments, the panel 12 may further include a test key TK and an alignment key AK. The test key TK and the alignment key AK may be disposed on the substrate 102a and in the peripheral area BA. The wiring structure 104 may be disposed adjacent to the test key TK and the alignment key AK. In accordance with some embodiments, the wiring structure 104 may be closer to the active area AA compared with the test key TK and the alignment key AK. In accordance with some embodiments, some of the wires 104w may be electrically connected to the test key TK, but it is not limited thereto.

As shown in FIG. 2, the adhesive material 106 may be disposed in the peripheral area BA. In addition, at least a portion of the wiring structure 104 may overlap the adhesive material 106 in the normal direction of the substrate 102a (e.g., the Z direction in the drawing). In accordance with some embodiments, the wires 104w of the wiring structure 104 may include some bent portions or turning portions. For example, a portion P1 may be the bent portions of the wires 104w of the wiring structure 104.

Figure 3:
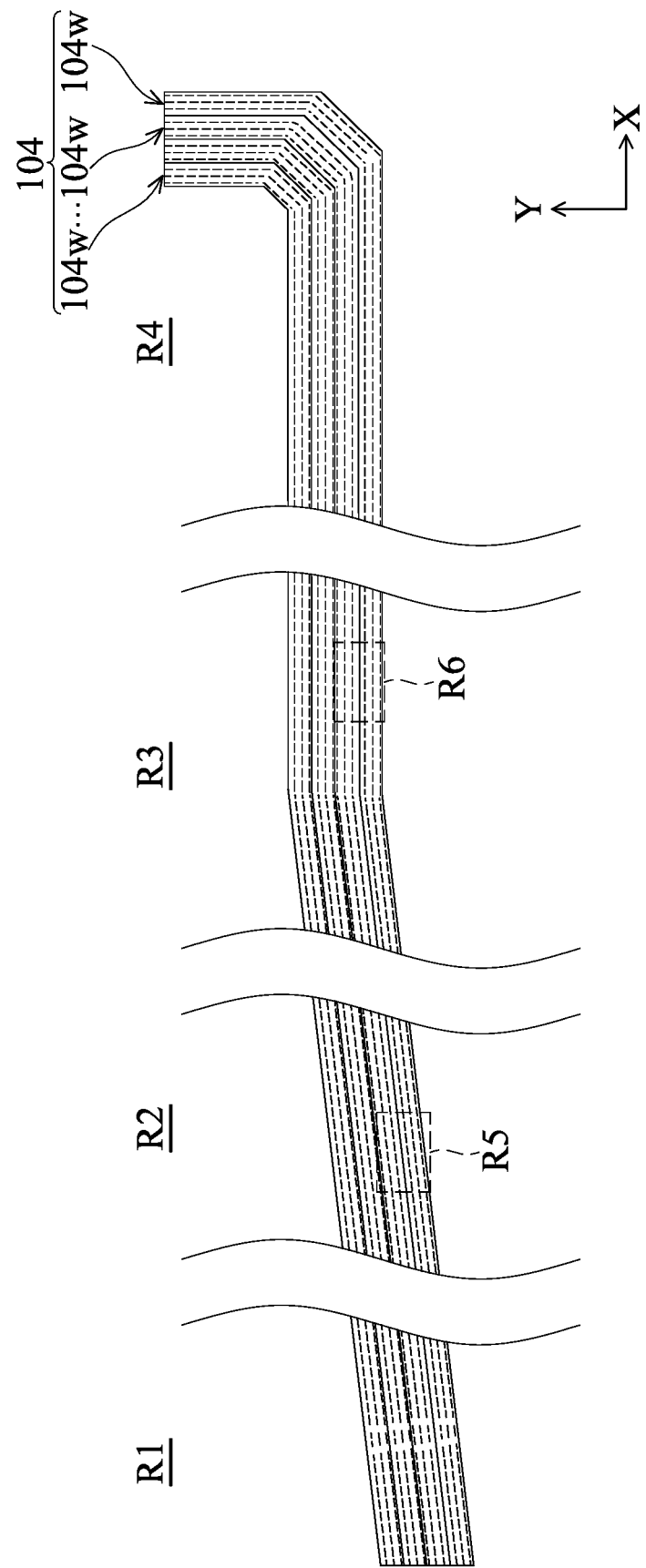
FIG. 3 is an enlarged diagram of some areas of an electronic device in FIG. 2 in accordance with some embodiments of the present disclosure.

Refer to FIG. 3, which is an enlarged diagram of an area R1, an area R2, an area R3, and an area R4 of the electronic device 10 in FIG. 2 in accordance with some embodiments of the present disclosure. As shown in FIG. 3, the wires 104w may extend along various different directions. In accordance with some embodiments, the configurations of the apertures OP in the area R1, area R2, area R3, and area R4 may be different. Specifically, the dimension, the amount, or the shape of the apertures OP of each wire 104w may be varied according to different positions.

Figure 4A:
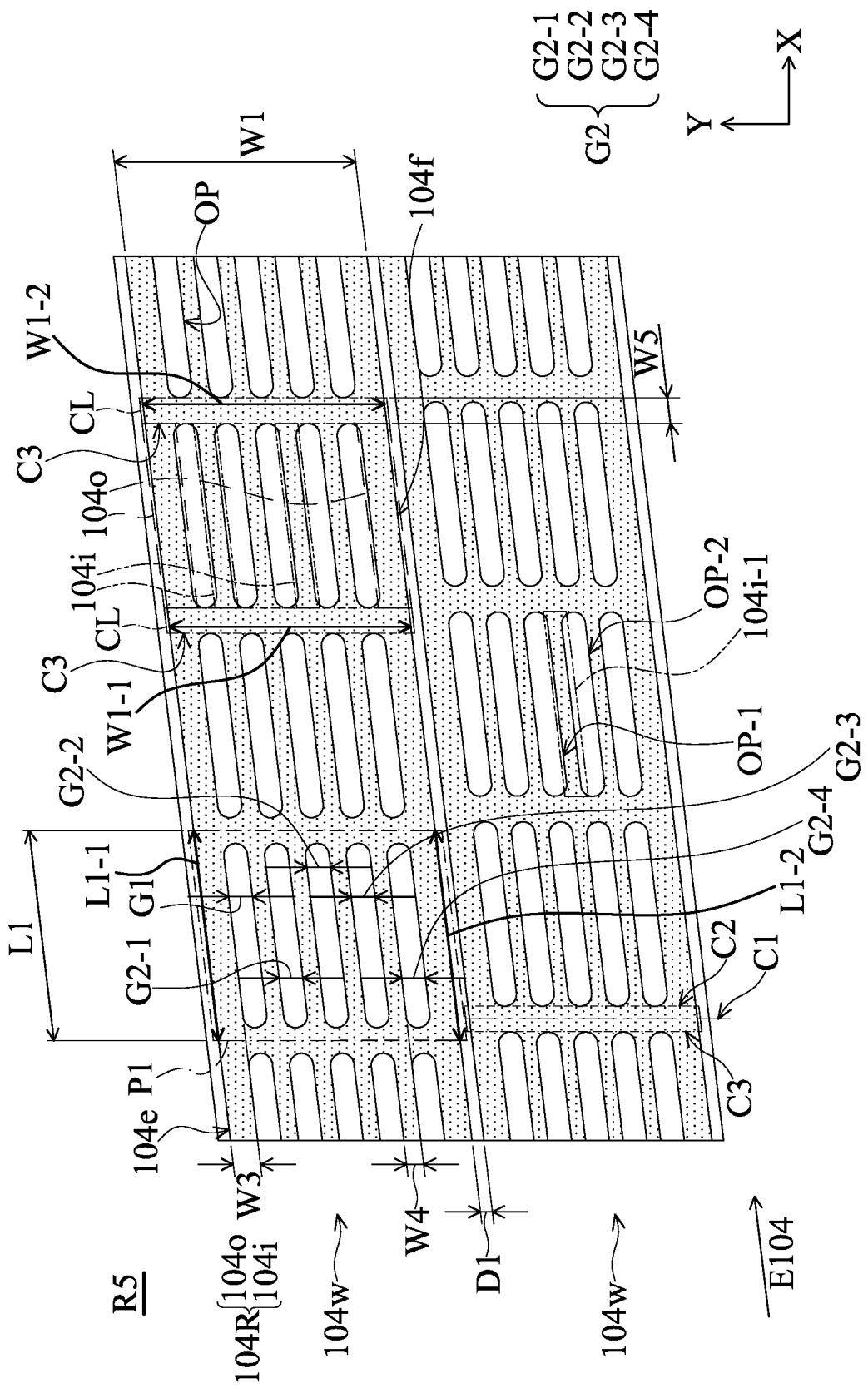
FIG. 4A is an enlarged diagram of an area of an electronic device in FIG. 3 in accordance with some embodiments of the present disclosure.
Figure 4B:
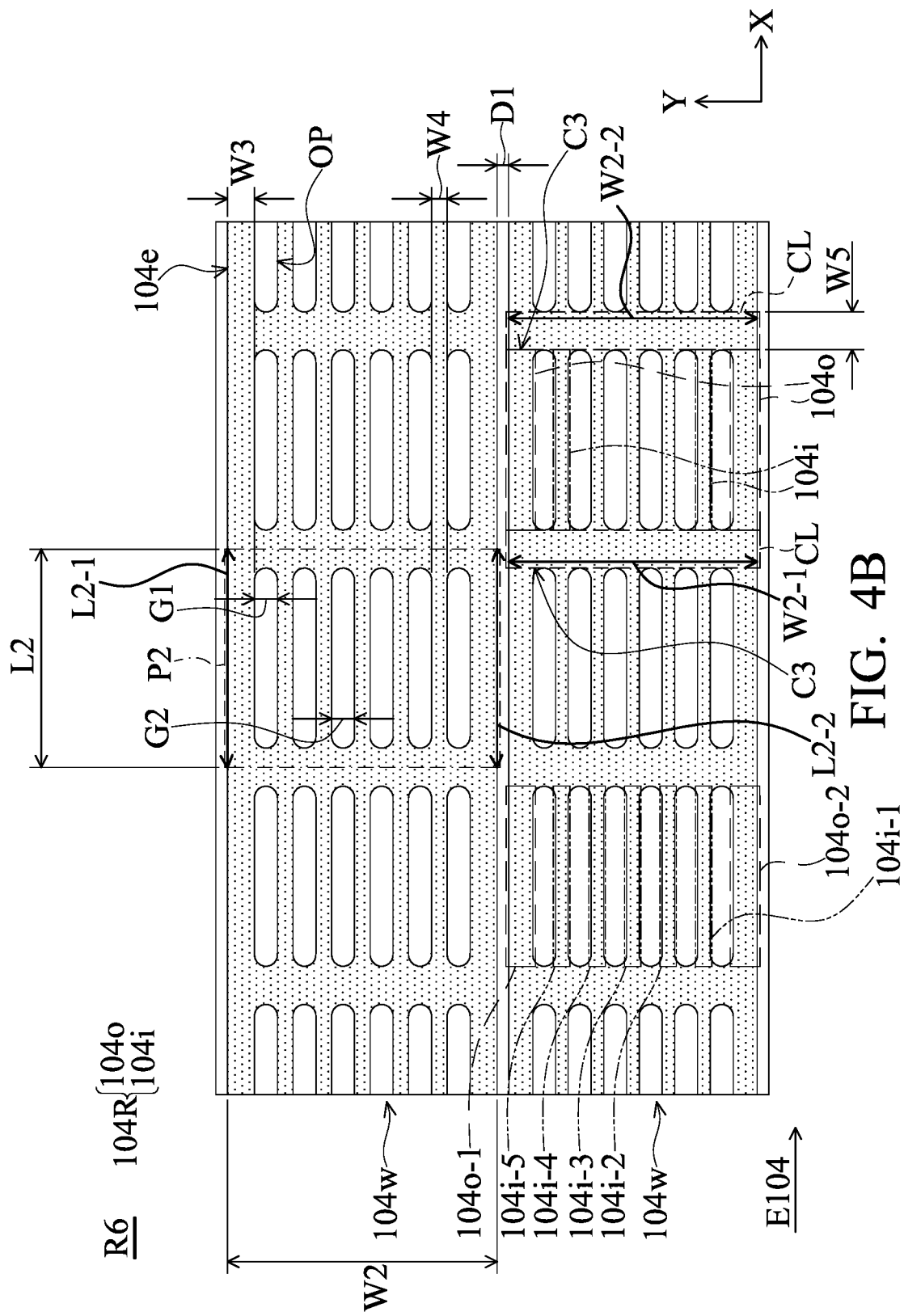
FIG. 4B is an enlarged diagram of an area of an electronic device in FIG. 3 in accordance with some embodiments of the present disclosure.

Refer to FIG. 4A and FIG. 4B, which are respectively enlarged diagrams of an area R5 and an area R6 of the electronic device 10 in FIG. 3 in accordance with some embodiments of the present disclosure. As shown in FIG. 4A and FIG. 4B, the configuration of the wire 104w in the area R5 and the area R6 are different. In accordance with some embodiments, the wire 104w may include a plurality of branch portions 104R. In accordance with some embodiments, the branch portions 104R may have inner branch portions 104i and outer branch portions 104o. The outer branch portions 104o may be adjacent to one of the inner branch portions 104i. The inner branch portion 104i is located between the apertures OP. For example, as shown in FIG. 4A, an inner branch portion 104i-1 is located between an aperture OP-1 and an aperture OP-2. The outer branch portion 104o is located between the aperture OP and an edge 104e of the wire 104w. In addition, the wire 104w may include a plurality of connection portions CL, and the connection portions CL may be the portions that connect the adjacent inner branch portions 104i and the adjacent outer branch portions 104o. Furthermore, an extending direction of the connection portion CL may be perpendicular to an extending direction E104 of the wire 104w.

In accordance with the embodiments of the present disclosure, the phrase "extending direction" of an object refers to a direction along, or substantially parallel to, the long axis of the object. In addition, in accordance with some embodiments, the extending direction E104 of the wire 104w refers to the extending direction of the outer branch portion 104o of the wire 104w that is farther away from the active area AA. For example, referring to FIG. 4A, the extending direction E104 of the wire 104w refers to the extending direction of an edge 104f of the wire 104w.

As shown in FIG. 4A and FIG. 4B, each of the wire 104w may have a first portion P1 and a second portion P2, and the first portion P1 and the second portion P2 respectively have a first width W1 and a second width W2. The second width W2 may be different from the first width W1. In addition, at least one of the wires 104w satisfies the following equation:

$$0 \leq |AR2 - AR1| < \frac{|W2 - W1|}{W1},$$

wherein AR1 and AR2 are the aperture ratios of the first portion P1 and the second portion P2, respectively. In accordance with some embodiments, all of the plurality of wires 104w satisfy the above equation.

Specifically, in accordance with the embodiments of the present disclosure, the first portion P1 and the second portion P2 may be two portions randomly selected from the same wire 104w. In accordance with the embodiments, an extending direction of the first portion P1 may be different from an extending direction of the second portion P2. In addition, each portion may be defined as a region of the wire 104w that is between the central lines C1 of two adjacent connection portions CL. Alternatively, each portion may be defined as a region of the wire 104w that is between the rightmost sides C2 of two adjacent connection portions CL, or a region of the wire 104w that is between the leftmost sides C3 of two adjacent connection portions CL.

It should be noted that the areas of the first portion P1 and the second portion P2 illustrated in FIG. 4A and FIG. 4B include small portions between two adjacent wires 104w for clarity of the drawing, however, the first portion P1 and the second portion P2 actually do not include such portions. Instead, the first portion P1 and the second portion P2 refer to the areas between the edges of the wire 104w (e.g., the edge 104e and the edge 104f).

In addition, as shown in FIG. 4A, the first width W1 of the first portion P1 refers to an average width of two edges of the first portion P1 (i.e. the edges of the connection portions CL), and these edges of the first portion P1 are substantially perpendicular to the extending direction E104 of the wire 104w. More specifically, if the leftmost sides C3 are two of the edges of the first portion P1, one of the leftmost sides C3 has a width W1-1 and the other has a width W1-2, and the first width W1 of the first portion P1 refers to an average of the width W1-1 and the width W1-2. As shown in FIG. 4B, the second width W2 of the second portion P2 refers to an average width of two edges of the second portion P2 (i.e. the edges of the connection portions CL), and these edges of the second portion P2 are substantially perpendicular to the extending direction E104 of the wire 104w. More specifically, if the leftmost sides C3 are two of the edges of the second portion P2, one of the leftmost sides C3 has a width W2-1 and the other has a width W2-2, and the second width W2 of the second portion P2 refers to an average of the width W2-1 and the width W2-2.

In accordance with some embodiments, the first width W1 may be in a range from 20 micrometers (μm) to 250 micrometers (20 μm≤the first width W1≤250 μm). In accordance with some embodiments, the second width W2 may be in a range from 20 μm to 250 μm (20 μm≤the second width W2≤250 μm), but it is not limited thereto.

In accordance with the embodiments of the present disclosure, the width and the length of the component can be measured from an optical microscope image, and the thickness of the component can be measured from a cross-sectional image in an electron microscope, but it is not limited thereto. In accordance with some embodiments, an optical microscope (OM), a scanning electron microscope (SEM), a film thickness profiler (α-step), an ellipsometer or another suitable method may be used to measure the width, length, thickness of each element or the distance between elements. Specifically, in accordance with some embodiments, a scanning electron microscope can be used to obtain any cross-sectional image including the elements to be measured, and the width, length, thickness or distance between the elements in the image can be measured.

Moreover, the aperture ratio AR1 of the first portion P1 refers to a ratio of a transmittance area (i.e. the areas of the apertures OP in the first portion P1) to an area of the first portion P1. The aperture ratio AR2 of the second portion P2 refers to a ratio of a transmittance area (i.e. the areas of the apertures OP in the second portion P2) to an area of the second portion P2. In accordance with some embodiments, the aperture ratio AR1 may be different from the aperture ratio AR2. In accordance with some embodiments, the aperture ratio AR1 may be in a range from 10% to 70% (10%≤the aperture ratio AR1≤70%). In accordance with some embodiments, the aperture ratio AR2 may be in a range from 10% to 70% (10%≤the aperture ratio AR2≤70%). In addition, the same unit is used to calculate the apertures OP and the first portions P1.

Specifically, in accordance with some embodiments, the optical microscope image that includes the first portion P1 or the second portion P2 can be converted to black and white image (for example, the color of the image can be removed, and the contrast or gamma correction can be adjusted) using an image processing software, e.g., Photoimpact. The white areas in the processed image refer to the transmittance area and the white areas plus the black areas refer to the area of the first portion P1 or the second portion P2. The aperture ratio can be obtained by dividing the white areas with the white areas plus the black areas, but the present disclosure is not limited thereto.

It should be noted that in accordance with some embodiments, the width and the aperture ratio of the wires 104w of the wiring structure 104 are controlled to satisfy the following equation:

$$0 \leq |AR2 - AR1| < \frac{|W2 - W1|}{W1}.$$

Accordingly, the curing performance of the adhesive material 106 in different areas of the electronic device 10 may be more consistent, or the resistance of the wiring structure 104 may be reduced.

In accordance with some embodiments, the difference between the aperture ratio AR1 and the aperture ratio AR2 may be achieved by means of the difference in the number of apertures OP in the first portion P1 and in the second portion P2. In accordance with some embodiments, the aperture ratio AR1 may be different from the aperture ratio AR1 by less than 10%, for example, the difference between the aperture ratio AR1 and the aperture ratio AR2 may be in a range from 0% to 10%, or from 2% to 6%, or from 3% to 5%. Therefore, the curing performance of the adhesive material 106 can be more consistent.

In addition, as shown in FIG. 4A and FIG. 4B, the first portion P1 and the second portion P2 respectively have a first length L1 and a second length L2. The first length L1 of the first portion P1 refers to an average length of two edges of the first portion P1 (i.e. the outer edges of the outer branch portions 104o), and these edges of the first portion P1 are substantially parallel to the extending direction E104 of the wire 104w. More specifically, if the outer edges of the outer branch portions 104o are two of the edges of the first portion P1, one of the outer edges of the outer branch portions 104o has a length L1-1 and the other has a length L1-2, and the first length L1 of the first portion P1 refers to an average of the length L1-1 and the length L1-2. As shown in FIG. 4B, the second length L2 of the second portion P2 refers to an average length of two edges of the second portion P2 (i.e. the outer edges of the outer branch portions 104o), and these edges of the second portion P2 are substantially parallel to the extending direction E104 of the wire 104w. More specifically, if the outer edges of the outer branch portions 104o are two of the edges of the second portion P2, one of the outer edges of the outer branch portions 104o has a length L2-1 and the other has a length L2-2, and the second length L2 of the second portion P2 refers to an average of the length L2-1 and the length L2-2. In accordance with some embodiments, the area of the first portion P1 may also be obtained by multiplying the first width W1 by the first length L1, and the area of the second portion P2 may also be obtained by multiplying the second width W2 by the second length L2.

In accordance with some embodiments, the first length L1 may be in a range from 50 µm to 500 µm (50 µm≤the first length L1≤500 µm). In accordance with some embodiments, the second length L2 may be in a range from 50 µm to 500 µm (50 µm≤the second length L2≤500 µm).

In accordance with some embodiments, the outer branch portion 104o may have a third width W3, and the third width W3 may be in a range from 5 µm to 40 µm (5 µm≤the third width W3≤40 µm). In accordance with some embodiments, the inner branch portions 104i may have a fourth width W4, and the fourth width W4 may be in a range from 5 µm to 30 µm (5 µm≤the fourth width W4≤30 µm). In accordance with some embodiments, the third width W3 may be greater than or equal to the fourth width W4. In accordance with some embodiments, a total width of the branch portions 104R may be in a range from 10 µm to 150 µm (10 µm≤the total width of the branch portions 104R≤150 µm). In detail, as shown in FIG. 4B, a total width of the branch portions 104R may be a total width of an outer branch portion 104o-1, an outer branch portion 104o-2 and inner branch portions 104i-1 to 104i-5.

In addition, the third width W3 refers to the maximum width of the outer branch portion 104o along the direction that is perpendicular to the extending direction E104 of the wire 104w. The fourth width W4 refers to the maximum width of the inner branch portions 104i along the direction that is perpendicular to the extending direction E104 of the wire 104w.

Moreover, it should be noted that the number of branch portions 104R (the total number of outer branch portions 104o and the inner branch portions 104i) in each portion is not limited to those shown in the drawings. In accordance with some embodiments, the number of branch portions 104R in each portion may be in a range from 1 to 20 (1≤the number of branch portions 104R≤20).

In accordance with some embodiments, the second width W2 of the second portion P2 may be greater than the first width W1 of the first portion P1, and the total width of the branch portions 104R (the outer branch portions 104o and the inner branch portions 104i) in the second portion P2 may be greater than or equal to the total width of the branch portions 104R in the first portion P1. In accordance with some embodiments, the width of the branch portions 104R (the outer branch portion 104o or the inner branch portion 104i) in the first portion P1 may be different from the width of the branch portions 104R (the outer branch portion 104o or the inner branch portion 104i) in the second portion P2. For example, the width of one of the outer branch portion 104o in the first portion P1 may be different from the width of one of the outer branch portion 104o in the second portion P2. In accordance with some embodiments, the width of the branch portions 104R (the outer branch portion 104o or the inner branch portion 104i) in the first portion P1 may be the same as the width of the branch portions 104R (the outer branch portion 104o or the inner branch portion 104i) in the second portion P2. In other words, as the width of the wire 104w is increased, the total width of the branch portions 104R or the width of each branch portion 104R can be adjusted (e.g., increasing) to maintain the difference of the aperture ratio AR1 and the aperture ratio AR2 in a certain range, for example, less than 10%. Therefore, the curing performance of the adhesive material 106 in different areas of the electronic device can be more consistent or the resistance of the wiring structure 104 can be reduced.

In accordance with some embodiments, the difference between the aperture ratio AR1 and the aperture ratio AR2 may be achieved by means of the difference in the dimensions of apertures OP in the first portion P1 and the second portion P2. It should be noted that, the dimensions of apertures OP may refer to a gap width of one of the apertures OP or a total gap width of the apertures OP. More specifically, the aperture OP that is closest to the outer branch portion 104o in one portion, for example in the first portion P1, may have a first gap width G1, and the aperture OP that is disposed between the inner branch portions 104i may have a second gap width G2. In accordance with some embodiments, the first gap width G1 may be in a range from 1 µm to 50 µm (1 µm≤the first gap width G1≤50 µm). In accordance with some embodiments, the second gap width G2 may be in a range from 1 µm to 50 µm (1 µm≤the second gap width G2≤50 µm). In accordance with some embodiments, the first gap width G1 may be the same as or different from the second gap width G2. In accordance with some embodiments, a total gap width (i.e. the sum of the first gap widths G1 and the second gap widths G2) in one portion may be in a range from 1 µm to 180 µm (1 µm≤the total gap width≤180 µm). For example, as shown in FIG. 4A, the total gap width in in the first portion P1 is the sum of the first gap width G1, a second gap width G2-1, a second gap width G2-2, a second gap width G2-3, a second gap width G2-4. In some embodiments, the second gap width G2-1, the second gap width G2-2, the second gap width G2-3 and the second gap width G2-4 may be the same or different, it is not limited thereto. It should be noted that, the second gap width G2-1, the second gap width G2-2, the second gap width G2-3 and the second gap width G2-4 have the same unit, for example, micrometer.

The first gap width G1 refers to the maximum width of the aperture OP that is closest to the outer branch portion 104o along the direction that is perpendicular to the extending direction E104 of the wire 104w. The second gap width G2 refers to the maximum width of the aperture OP that is disposed between the inner branch portions 104i along the direction that is perpendicular to the extending direction E104 of the wire 104w.

Moreover, it should be noted that the number of apertures OP in each portion is not limited to those shown in the drawings. In accordance with some embodiments, the number of apertures OP in each portion may be in a range from 1 to 20 (1≤the number of apertures OP≤20). In addition, in accordance with some embodiment, the aperture OP may have a rounded corner, or a curved edge.

In accordance with some embodiments, the second width W2 of the second portion P2 may be greater than the first width W1 of the first portion P1, and the number of apertures OP in the second portion P2 may be greater than or equal to the number of apertures in the first portion P1. In other words, as the width of the wire 104w is increased, the number of apertures OP can be adjusted (e.g., increasing) to maintain the difference of the aperture ratio AR1 and the aperture ratio AR2 in a certain range, for example, less than 10%.

In addition, in accordance with some embodiments, the total gap width (the sum of the first gap widths G1 and the second gap widths G2) of the apertures OP in the second portion P2 may be greater than or equal to the total gap width of the apertures OP in the first portion P1. In accordance with some embodiments, if the dimensions of apertures is the gap width of one of the apertures, the second width may be greater than the first width, and the gap width (first gap width G1 or the second gap width G2) of the apertures OP in the second portion P2 may be different from the gap width (first gap width G1 or the second gap width G2) of the apertures OP in the first portion P1. In accordance with some embodiments, the gap width (first gap width G1 or the second gap width G2) of the apertures OP in the second portion P2 may be the same as the gap width (first gap width G1 or the second gap width G2) of the apertures OP in the first portion P1. In other words, as the width of the wire 104w is increased, the total gap width of the apertures OP or each gap width of the apertures OP can be adjusted to maintain the difference of the aperture ratio AR1 and the aperture ratio AR2 in a certain range, for example, less than 10%.

In accordance with some embodiments, the connection portion CL may have a fifth width W5, and the fifth width W5 may be in a range from 2 μm to 40 μm (2 μm≤the fifth width W5≤40 μm). The fifth width W5 refers to the maximum width of the connection portion CL along the direction that is parallel to the extending direction E104 of the wire 104w.

In accordance with some embodiments, two adjacent wires 104w may be separated from each other for a distance D1, and the distance D1 may be in a range from 1 μm to 50 μm (1 μm≤the distance D1≤50 μm). The distance D1 refers to the maximum distance between two adjacent wires 104w along the direction that is perpendicular to the extending direction E104 of the wire 104w.

Specifically, in one embodiment shown in FIG. 4A and FIG. 4B, the first width W1 may be in a range from 125 μm to 160 μm (125 μm≤the first width W1≤160 μm), e.g., 135 μm. The second width W2 may be in a range from 125 μm to 160 μm (125 μm≤the second width W2≤160 μm), e.g., 157 μm. The aperture ratio AR1 may be in a range from 35% to 55% (35%≤the aperture ratio AR1≤50%), e.g., 43%. The aperture ratio AR2 may be in a range from 35% to 55% (35%≤the aperture ratio AR2≤55%), e.g., 46%. The difference between the aperture ratio AR1 and the aperture ratio AR1 may be less than or equal to 3%. The total width of the branch portions 104R in the first portion P1 may be in a range from 75 μm to 110 μm (75 μm≤the total width of the branch portions 104R≤110 μm), e.g., 85 μm. The total width of the branch portions 104R in the second portion P2 may be in a range from 75 μm to 110 μm (75 μm≤the total width of the branch portions 104R≤110 μm), e.g., 97 μm. The sum of the first gap widths G1 and the second gap widths G2 in the first portion P1 may be in a range from 45 μm to 80 μm (45 μm≤the sum of the first gap widths G1 and the second gap widths G2≤80 μm), e.g., 55 μm. The sum of the first gap widths G1 and the second gap widths G2 in the second portion P2 may be in a range from 45 μm to 80 μm (45 μm≤the sum of the first gap widths G1 and the second gap widths G2≤80 μm), e.g., 66 μm. In addition, the number of apertures OP in the first portion P1 or the second portion P2 may be in a range from 1 to 10 (1≤the number of apertures OP≤10). Specifically, the number of apertures OP in the first portion P1 may be 5, and the number of apertures OP in the second portion P2 may be 6.

Figure 5:
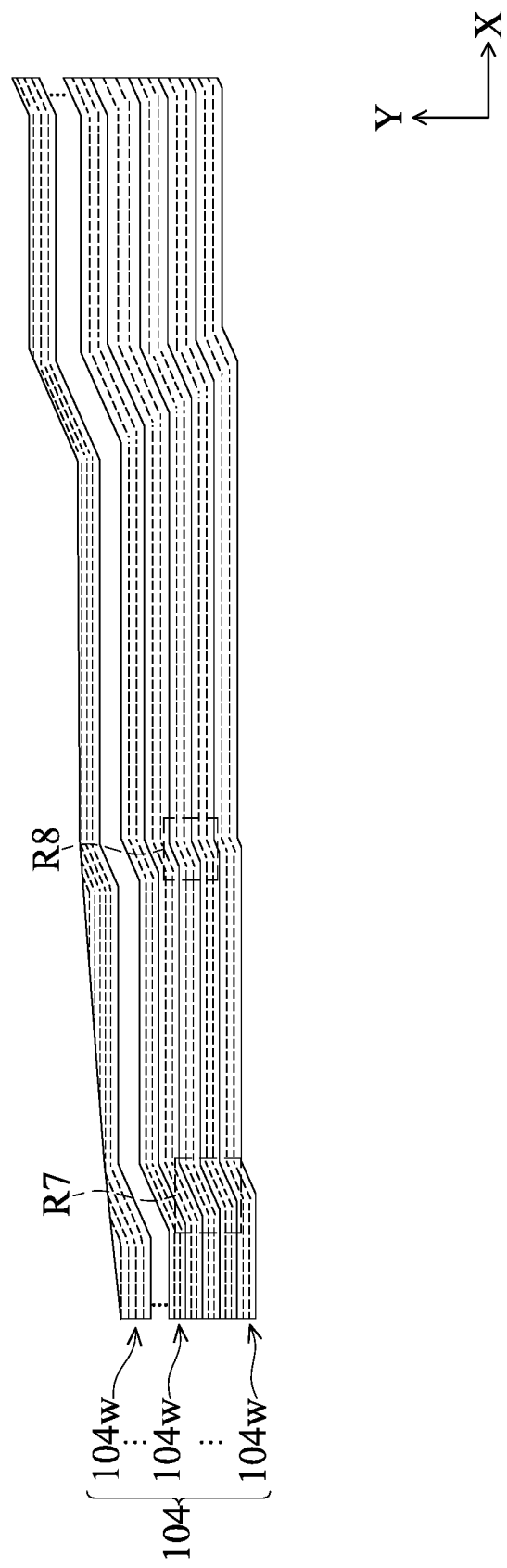
FIG. 5 is a top-view diagram of an area of an electronic device in accordance with some embodiments of the present disclosure.
Figure 6A:
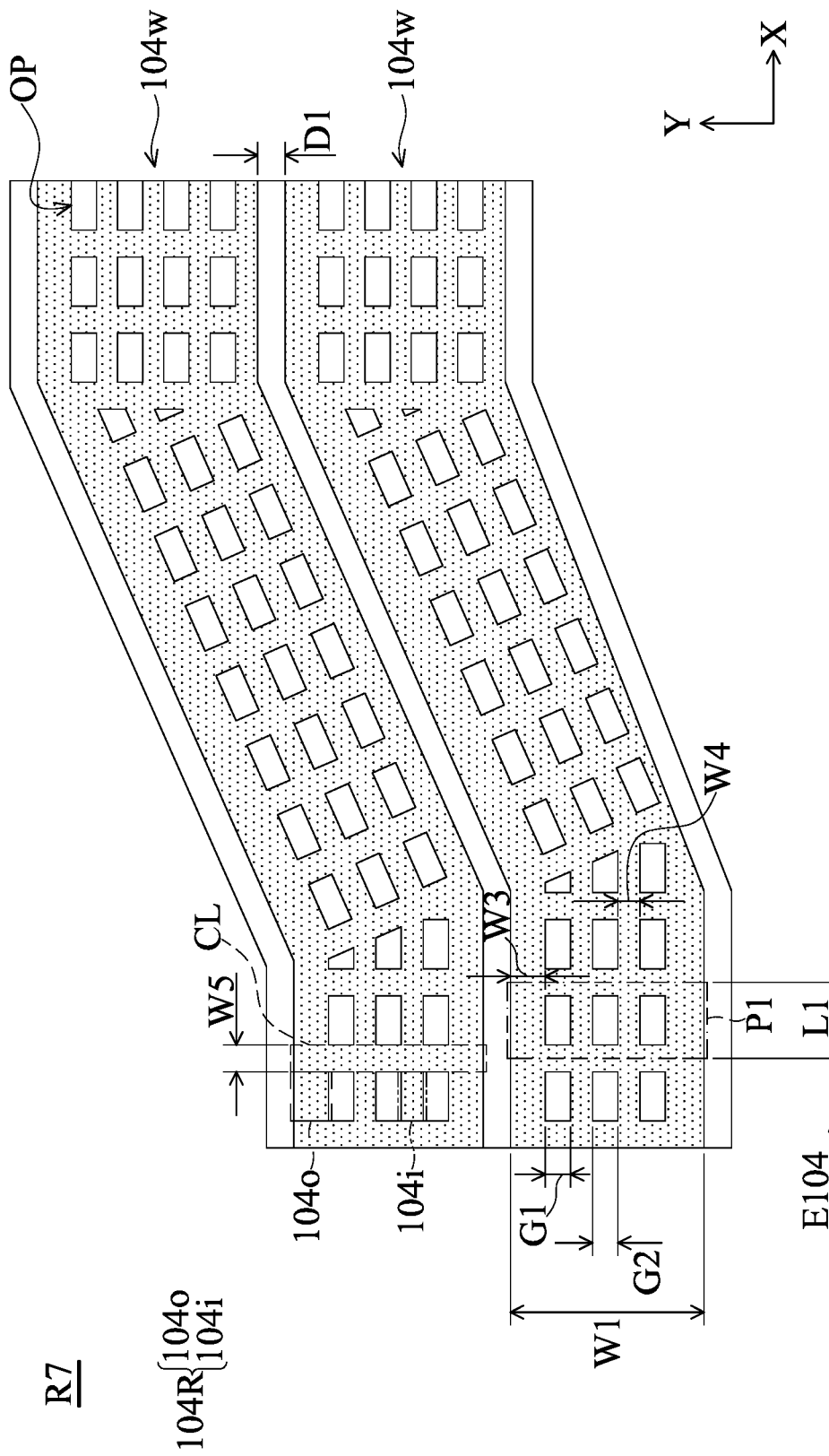
FIG. 6A is an enlarged diagram of an area of an electronic device in FIG. 5 in accordance with some embodiments of the present disclosure.
Figure 6B:
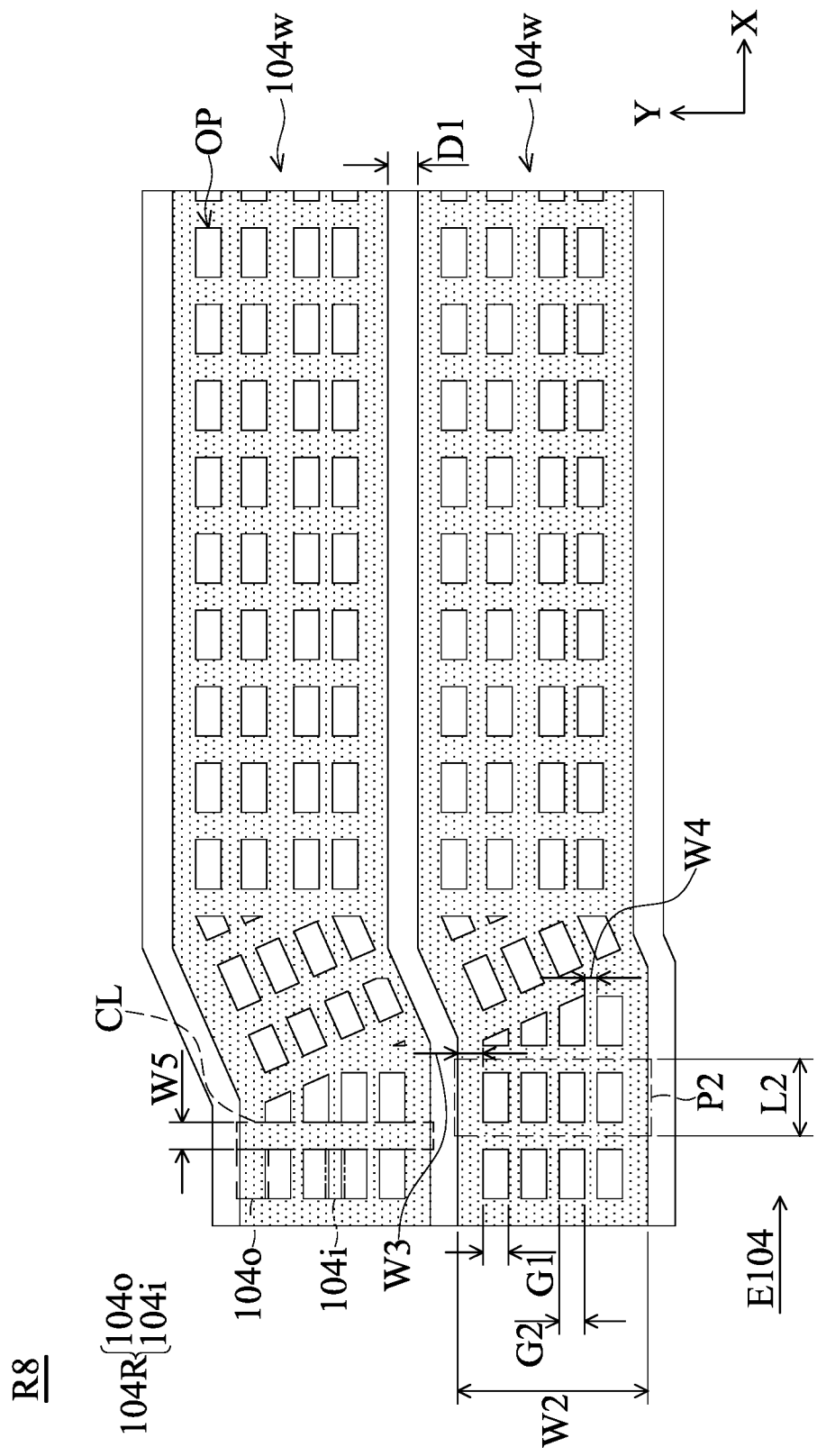
FIG. 6B is an enlarged diagram of an area of an electronic device in FIG. 5 in accordance with some embodiments of the present disclosure.

Refer to FIG. 5, FIG. 6A and FIG. 6B. FIG. 5 is a top-view diagram of an area of an electronic device in accordance with some other embodiments of the present disclosure. FIG. 6A and FIG. 6B respectively are enlarged diagrams of an area R7 and an area R8 of the electronic device in FIG. 5 in accordance with some embodiments of the present disclosure. It should be understood that, the same or similar reference numbers in the following paragraph have the same definition as described above, and thus they will not be repeated in the following context.

As shown in FIG. 6A and FIG. 6B, the configuration of the wire 104w in the area R7 and the area R8 are different. The extending direction E104 of wire 104 may change more than once in the area R7 and the area R8. In addition, the number of apertures OP in the area R7 may be different from that in the area R8. In accordance with the embodiments shown in FIG. 6A and FIG. 6B, the wire 104w also has the first portion P1 and the second portion P2, and the first portion P1 and the second portion P2 respectively have the first width W1 and the second width W2 different from the first width W1. In addition, the wire 104w also satisfies the equation:

$$0 \leq |AR2 - AR1| < \frac{|W2 - W1|}{W1}$$

as described above.

Specifically, in one embodiment shown in FIG. 6A and FIG. 6B, the first width W1 may be in a range from 130 μm to 190 μm (130 μm≤the first width W1≤190 μm), e.g., 148 μm. The second width W2 may be in a range from 130 μm to 190 μm (130 μm≤the second width W2≤190 μm), e.g., 178 μm. The aperture ratio AR1 of the first portion P1 may be in a range from 25% to 60% (25%≤the aperture ratio AR1≤60%), e.g., 38%. The aperture ratio AR2 may be in a range from 25% to 60% (25%≤the aperture ratio AR2≤60%), e.g., 41%. The difference between the aperture ratio AR1 and the aperture ratio AR1 may be less than or equal to 3%. The total width of the branch portions 104R in the first portion P1 may be in a range from 65 μm to 110 μm (65 μm≤the total width of the branch portions 104R≤110 μm), e.g., 82 μm. The total width of the branch portions 104R in the second portion P2 may be in a range from 65 μm to 110 μm (65 μm≤the total width of the branch portions 104R≤110 μm), e.g., 90 μm. The sum of the first gaps G1 and the second gap G2 in the first portion P1 may be in a range from 50 μm to 100 μm (50 μm≤the sum of the first gaps G1 and the second gap G2≤100 μm), e.g., 66 μm. The sum of the first gaps G1 and the second gap G2 in the second portion P2 may be in a range from 50 μm to 100 μm (50 μm≤the sum of the first gaps G1 and the second gap G2≤100 μm), e.g., 88 μm. In addition, the number of apertures OP in the first portion P1 or the second portion P2 may be in a range from 1 to 8 (1≤the number of apertures OP≤8). Specifically, the number of apertures OP in the first portion P1 may be 3, and the number of apertures OP in the second portion P2 may be 4.

Figure 7:
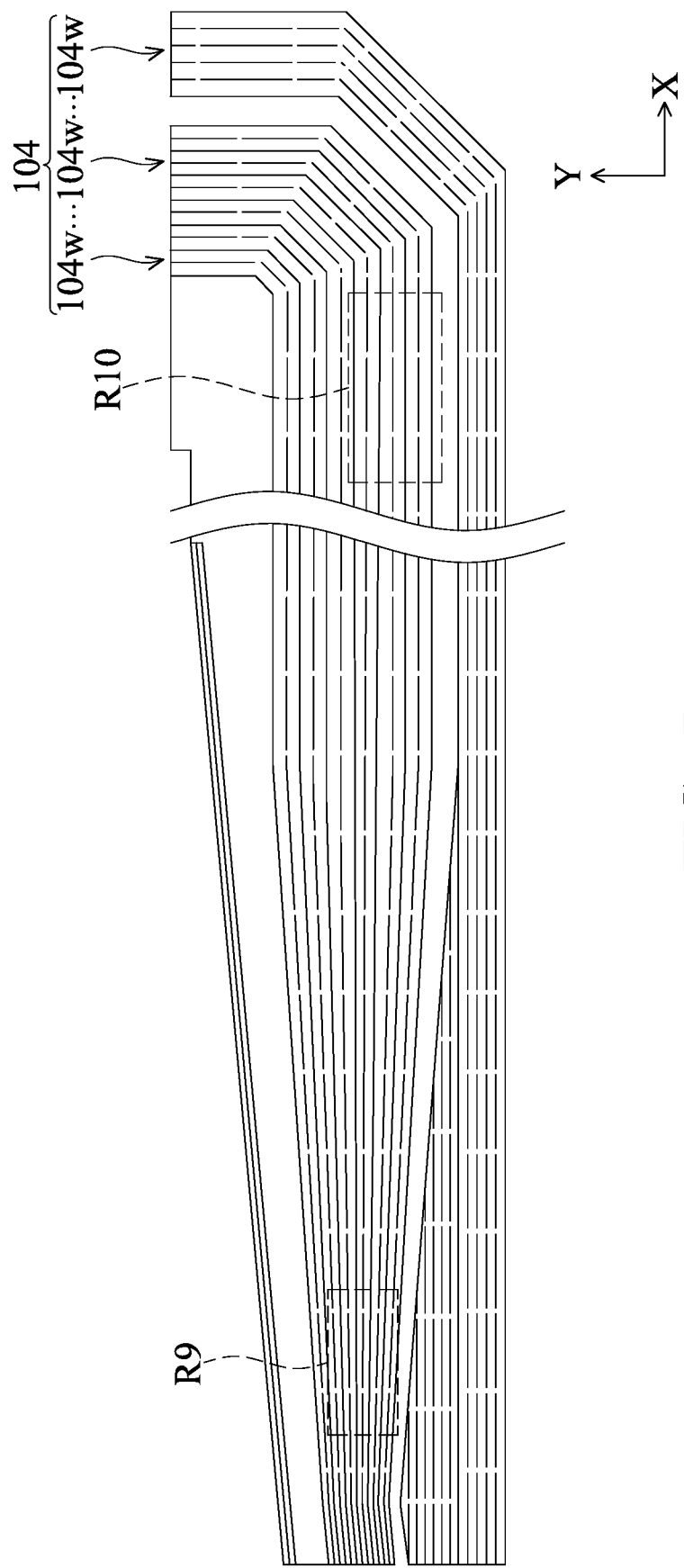
FIG. 7 is a top-view diagram of an area of an electronic device in accordance with some embodiments of the present disclosure.
Figure 8A:
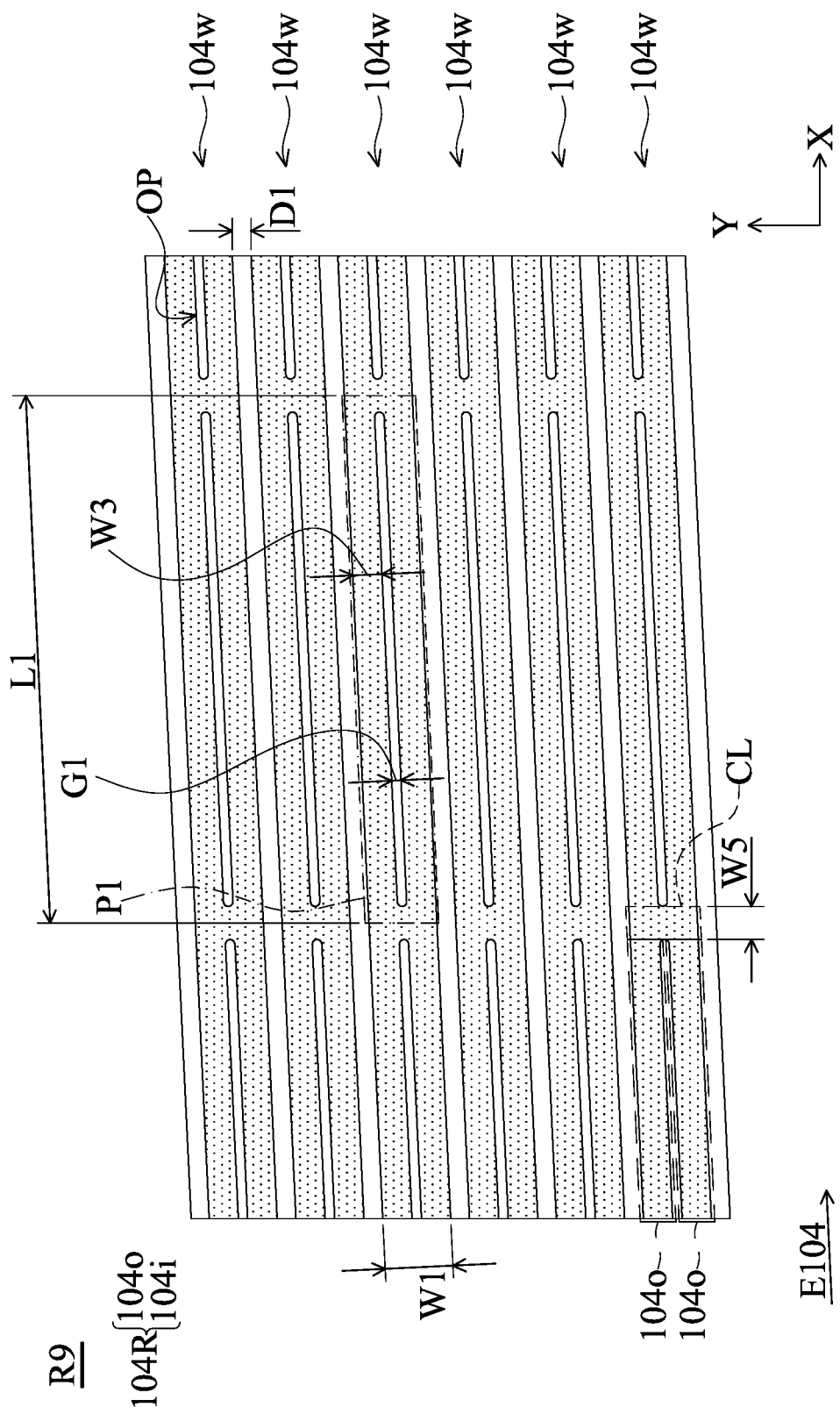
FIG. 8A is an enlarged diagram of an area of an electronic device in FIG. 7 in accordance with some embodiments of the present disclosure.
Figure 8B:
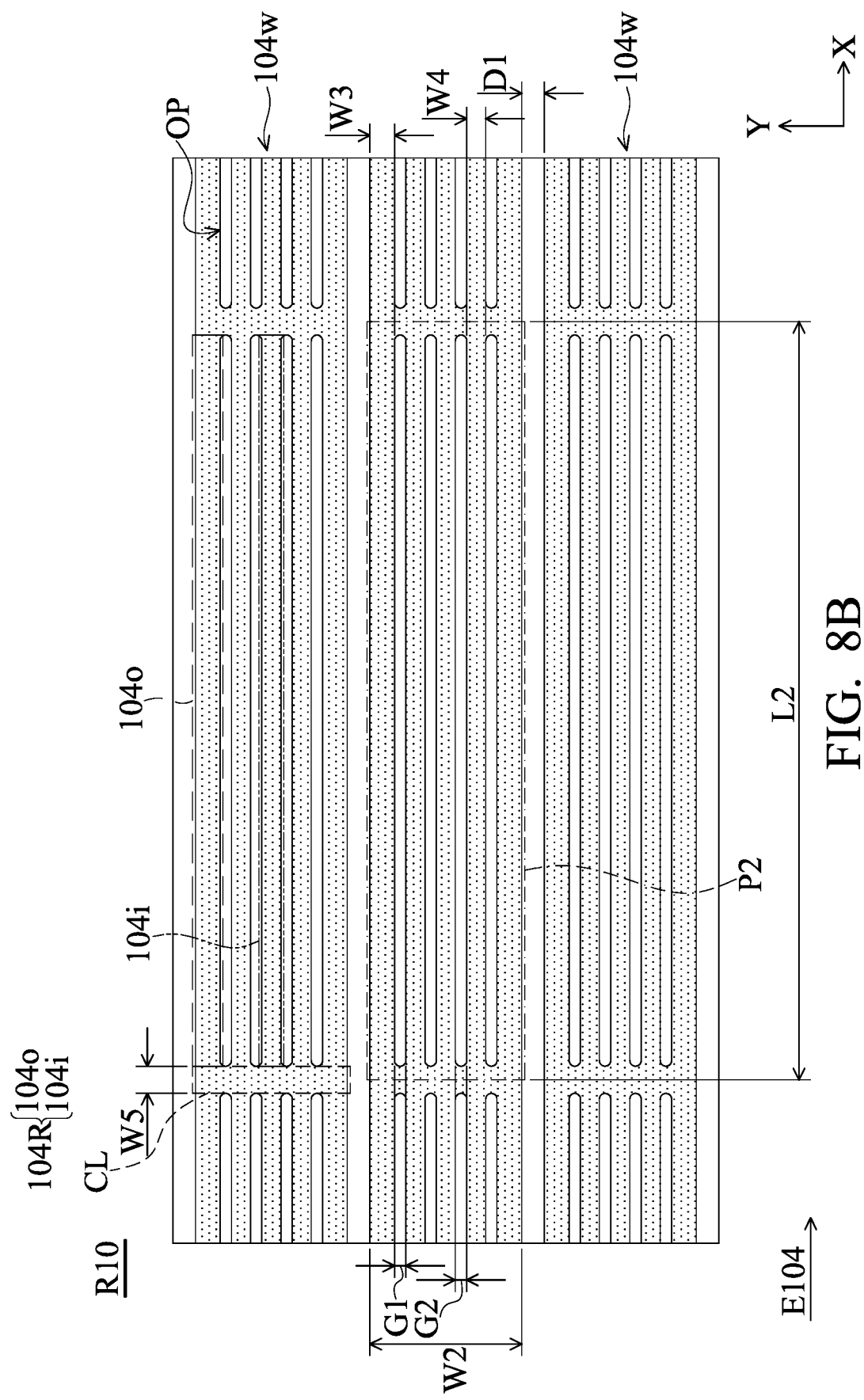
FIG. 8B is an enlarged diagram of an area of an electronic device in FIG. 7 in accordance with some embodiments of the present disclosure.

Refer to FIG. 7, FIG. 8A and FIG. 8B. FIG. 7 is a top-view diagram of an area of an electronic device in accordance with some other embodiments of the present disclosure. FIG. 8A and FIG. 8B respectively are enlarged diagrams of an area R9 and an area R10 of the electronic device in FIG. 7 in accordance with some embodiments of the present disclosure.

As shown in FIG. 8A and FIG. 8B, the configuration of the wire 104w in the area R9 and the area R10 are different. The extending direction E104 of the wire 104 in the area R9 may be different from that in the area R10. In addition, the number of apertures OP in the area R9 may be different from that in the area R10. In accordance with the embodiments shown in FIG. 8A and FIG. 8B, the wire 104w also has the first portion P1 and the second portion P2, and the first portion P1 and the second portion P2 respectively have the first width W1 and the second width W2 different from the first width W1. In addition, the wire 104w also satisfies the equation:

$$0 \leq |AR2 - AR1| < \frac{|W2 - W1|}{W1}$$

as described above.

Specifically, in one embodiment shown in FIG. 8A and FIG. 8B, the first width W1 may be in a range from 25 μm to 120 μm (25 μm≤the first width W1≤120 μm), e.g., 41 μm. The second width W2 may be in a range from 25 μm to 120 μm (25 μm≤the second width W2≤120 μm), e.g., 91 μm. The aperture ratio AR1 of the first portion P1 may be in a range from 15% to 35% (15%≤the aperture ratio AR1≤35%), e.g., 27.5%. The aperture ratio AR2 may be in a range from 15% to 35% (15%≤the aperture ratio AR2≤35%), e.g., 29.5%. The difference between the aperture ratio AR1 and the aperture ratio AR1 may be less than or equal to 2%. The total width of the branch portions 104R in the first portion P1 may be in a range from 15 μm to 100 μm (15 μm≤the total width of the branch portions 104R≤100 μm), e.g., 30 μm. The total width of the branch portions 104R in the second portion P2 may be in a range from 15 μm to 100 μm (15 μm≤the total width of the branch portions 104R≤100 μm), e.g., 75 μm. The first portion P1 may have only one aperture OP and the first gap G1 of this aperture OP may be in a range from 5 μm to 40 μm (5 μm≤the first gap G1≤40 μm), e.g., 11 μm. The sum of the first gaps G1 and the second gap G2 in the second portion P2 may be in a range from 5 μm to 40 μm (5 μm≤the sum of the first gaps G1 and the second gap G2≤40 μm), e.g., 20 μm. In addition, the number of apertures OP in the first portion P1 or the second portion P2 may be in a range from 1 to 10 (1≤the number of apertures OP≤10). Specifically, the number of aperture OP in the first portion P1 may be 1, and the number of apertures OP in the second portion P2 may be 4.

Figure 9:
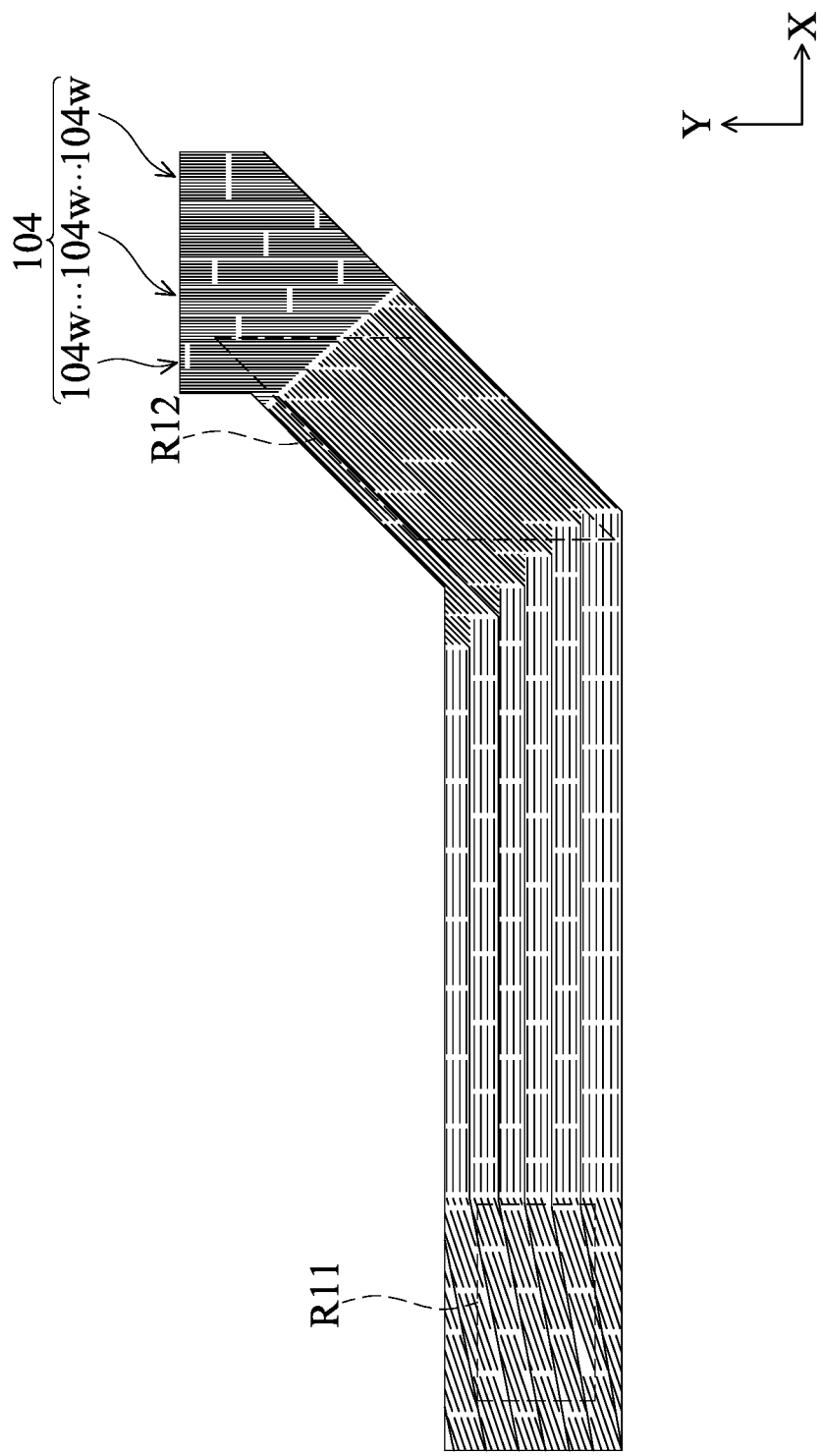
FIG. 9 is a top-view diagram of an area of an electronic device in accordance with some embodiments of the present disclosure.
Figure 10A:
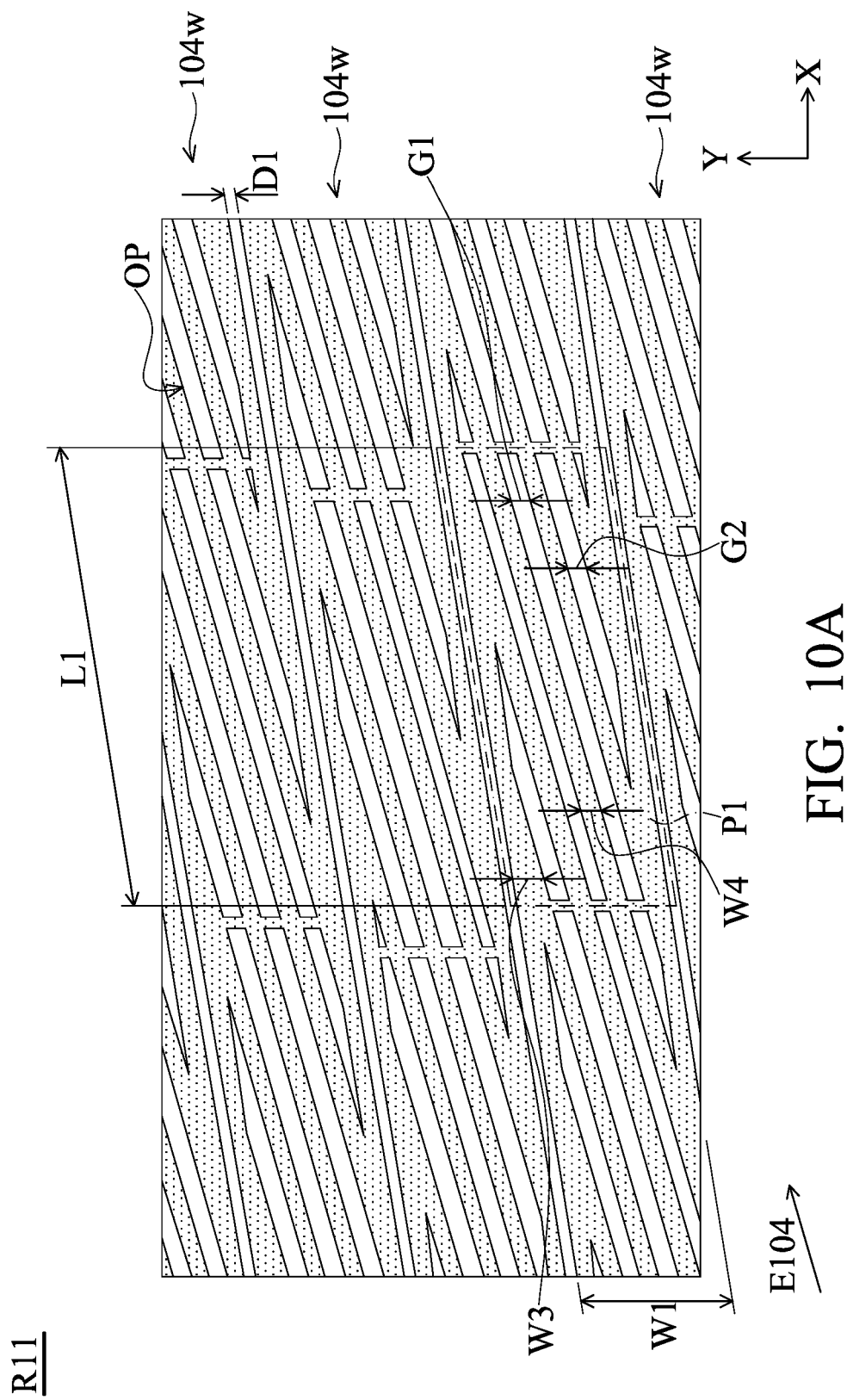
FIG. 10A is an enlarged diagram of an area of an electronic device in FIG. 9 in accordance with some embodiments of the present disclosure.
Figure 10B:
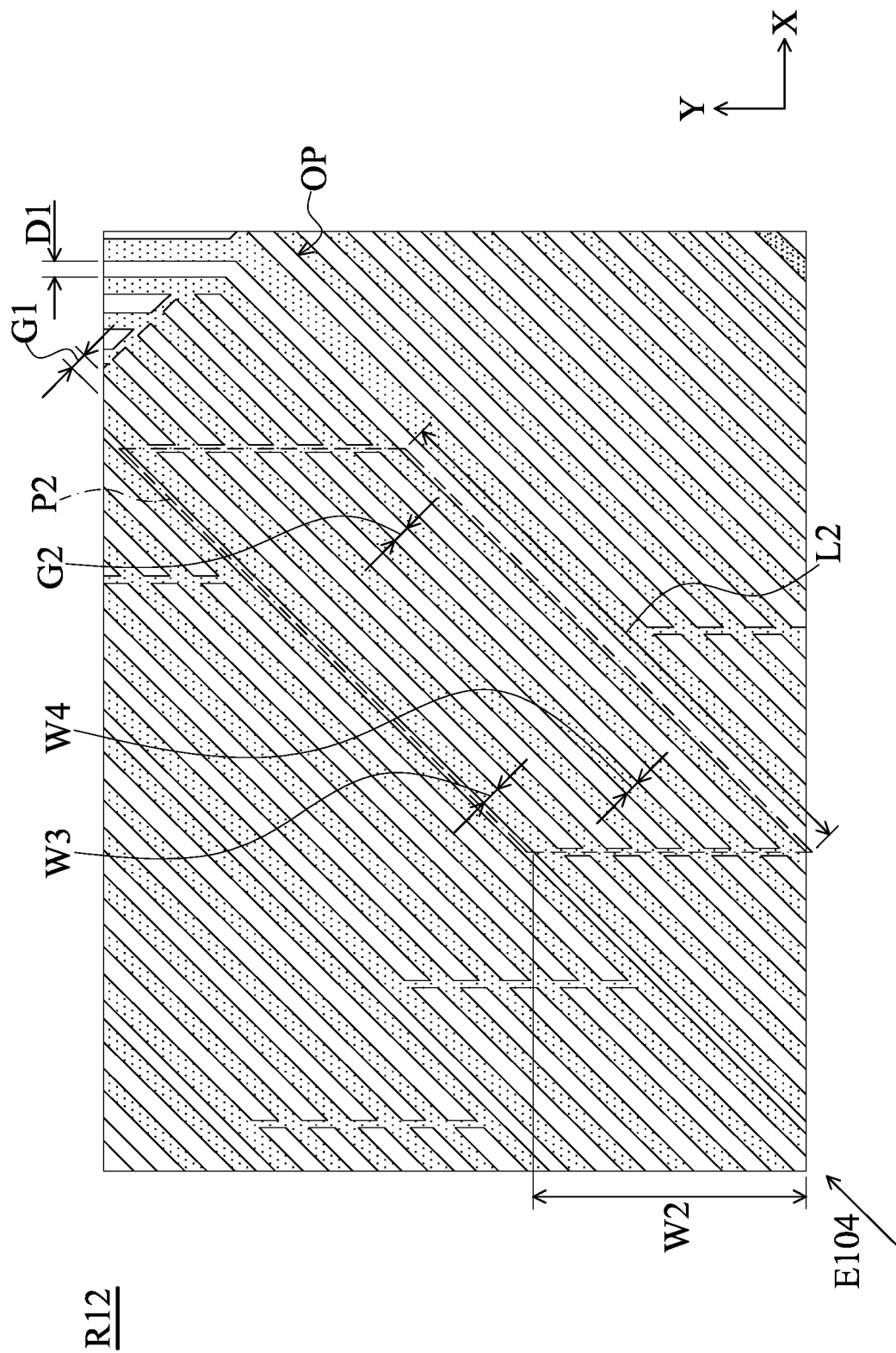
FIG. 10B is an enlarged diagram of an area of an electronic device in FIG. 9 in accordance with some embodiments of the present disclosure.

Refer to FIG. 9, FIG. 10A and FIG. 10B. FIG. 9 is a top-view diagram of an area of an electronic device in accordance with some other embodiments of the present disclosure. FIG. 10A and FIG. 10B respectively are enlarged diagrams of an area R11 and an area R12 of the electronic device in FIG. 9 in accordance with some embodiments of the present disclosure.

As shown in FIG. 10A and FIG. 10B, the configuration of the wire 104w in the area R11 and the area R12 are different. The extending direction E104 of the wire 104 in the area R11 may be different from that in the area R12. In addition, the number of apertures OP in the area R11 may be the same as that in the area R12. In accordance with the embodiments shown in FIG. 10A and FIG. 10B, the wire 104w also has the first portion P1 and the second portion P2, and the first portion P1 and the second portion P2 respectively have the first width W1 and the second width W2 different from the first width W1. In addition, the wire 104w also satisfies the equation:

$$0 \leq |AR2 - AR1| < \frac{|W2 - W1|}{W1}$$

as described above.

Specifically, in one embodiment shown in FIG. 10A and FIG. 10B, the first width W1 may be in a range from 120 μm to 210 μm (120 μm≤the first width W1≤210 μm), e.g., 140 μm. The second width W2 may be in a range from 120 μm to 210 μm (120 μm≤the second width W2≤210 μm), e.g., 195 μm. The aperture ratio AR1 of the first portion P1 may be in a range from 30% to 60% (30%≤the aperture ratio AR1≤60%), e.g., 41%. The aperture ratio AR2 may be in a range from 30% to 60% (30%≤the aperture ratio AR2≤60%), e.g., 46%. The difference between the aperture ratio AR1 and the aperture ratio AR1 may be less than or equal to 5%. The total width of the branch portions 104R in the first portion P1 may be in a range from 70 μm to 130 μm (70 μm≤the total width of the branch portions 104R≤130 μm), e.g., 90 μm. The total width of the branch portions 104R in the second portion P2 may be in a range from 70 μm to 130 μm (70 μm≤the total width of the branch portions 104R≤130 μm), e.g., 109 μm. The sum of the first gaps G1 and the second gap G2 in the first portion P1 may be in a range from 40 μm to 150 μm (40 μm≤the sum of the first gaps G1 and the second gap G2≤150 μm), e.g., 64 μm. The sum of the first gaps G1 and the second gap G2 in the second portion P2 may be in a range from 10 μm to 150 μm (40 μm≤the sum of the first gaps G1 and the second gap G2≤150 μm), e.g., 95 μm. In addition, the number of apertures OP in the first portion P1 or the second portion P2 may be in a range from 1 to 10 (1≤the number of apertures OP≤10). Specifically, the number of aperture OP in the first portion P1 may be 4, and the number of apertures OP in the second portion P2 may be 5.

To summarize, in accordance with some embodiments of the present disclosure, the width and the aperture ratio of the wiring structure in the electronic device are designed to satisfy a particular relationship. Accordingly, the curing performance of the adhesive material in different areas of the electronic device can be more consistent or the resistance of the wiring structure can be maintained.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. A wiring structure, comprising:
a plurality of wires, each of the plurality of wires has a first portion and a second portion, and the first portion and the second portion respectively have a first width W1 and a second width W2 that is different from the first width W1;
wherein at least one of the plurality of wires satisfies an equation as follows:

$$0 < |AR2 - AR1| < \frac{|W2 - W1|}{W1},$$

wherein AR1 and AR2 are aperture ratios of the first portion and the second portion, respectively, wherein AR1 is different from AR2, and a difference between AR1 and AR2 is less than 10%,
wherein apertures in the first portion and the second portion have a rounded corner or a curved edge, and
wherein the first width W1 is in a range from 20 μm to 250 μm, the second width W2 is in a range from 20 μm to 250 μm, AR1 is in a range from 10% to 70%, and AR2 is in a range from 10% to 70%.

2. The wiring structure as claimed in claim 1, wherein all of the plurality of wires satisfy the equation.

3. The wiring structure as claimed in claim 1, wherein the difference between AR1 and AR2 is achieved by means of a difference in number of apertures in the first portion and in the second portion.

4. The wiring structure as claimed in claim 3, wherein the second width is greater than the first width, and a number of apertures in the second portion is greater than or equal to a number of apertures in the first portion.

5. The wiring structure as claimed in claim 1, wherein the difference between AR1 and AR2 is achieved by means of a difference in dimensions of the apertures in the first portion and the second portion.

6. The wiring structure as claimed in claim 5, wherein the dimensions of the apertures is a total gap width of the apertures, the second width is greater than the first width, and the total gap width of the apertures in the second portion is greater than or equal to the total gap width of the apertures in the first portion.

7. The wiring structure as claimed in claim 5, wherein the dimensions of the apertures is a gap width of one of the apertures, the second width is greater than the first width, the gap width of one of the apertures in the second portion is different from the gap width of one of the apertures in the first portion.

8. The wiring structure as claimed in claim 1, wherein the second width is greater than the first width, and the each of the plurality of wires comprises a plurality of branch portions, a total width of the plurality of branch portions in the second portion is greater than or equal to a total width of the plurality of branch portions in the first portion.

9. The wiring structure as claimed in claim 8, wherein a width of one of the plurality of branch portions in the first portion is different from a width of one of the plurality of branch portions in the second portions.

10. The wiring structure as claimed in claim 9, wherein each of the plurality of branch portions has inner branch portions and outer branch portions adjacent to one of the inner branch portions, and the one of the plurality of branch portions in the first portion and the one of the plurality of branch portions in the second portions are the outer branch portions.

11. The wiring structure as claimed in claim 10, wherein the each of the plurality of wires comprises a plurality of connection portions and one of the plurality of connection portions is connected to two of the adjacent inner branch portions and two of the adjacent outer branch portions.

12. The wiring structure as claimed in claim 1, wherein an extending direction of the first portion is different from an extending direction of the second portion.

13. An electronic device, comprising:
a first substrate;
a second substrate;
the wiring structure as claimed in claim 1 disposed on at least one of the first substrate and the second substrate; and
an adhesive material sealing the first substrate and the second substrate;
wherein at least a portion of the wiring structure overlaps the adhesive material.

14. The electronic device as claimed in claim 13, which is an organic light-emitting diode display device.

15. The electronic device as claimed in claim 13, which is a liquid-crystal display device.

16. The electronic device as claimed in claim 13, which is a liquid-crystal antenna device.

17. The electronic device as claimed in claim 13, comprising a switch structure, wherein at least one of the plurality of wires is electrically connected to the switch structure.

18. The electronic device as claimed in claim 14, wherein the wiring structure as claimed in claim 1 is disposed between the adhesive material and the at least one of the first substrate and the second substrate.

* * * * *